Figure 2:
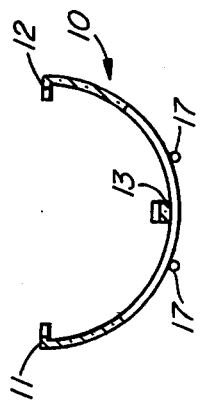

ium Patent [19]

United States Patent [19]
Jenkins

[11] Patent Number: 4,466,381
[45] Date of Patent: Aug. 21, 1984

[54] COATING OF SEMICONDUCTOR WAFERS AND APPARATUS THEREFOR

[75] Inventor: George M. Jenkins, Dunrobin, Canada

[73] Assignee: Northern Telecom Limited, Montreal, Canada

[21] Appl. No.: 508,411

[22] Filed: Jun. 28, 1983

Related U.S. Application Data

[63] Continuation of Ser. No. 250,163, Apr. 2, 1981, abandoned.

[30] Foreign Application Priority Data

Jan. 14, 1981 [CA] Canada .................................. 368517

[51] Int. Cl.³ ............................................ H01L 21/68
[52] U.S. Cl. .................................... 118/728; 118/500; 427/95
[58] Field of Search ..................... 118/500, 728; 427/95

[56] References Cited
U.S. PATENT DOCUMENTS

| | | |
|---|---|---|
| 3,918,756 | 11/1975 | Saville et al. |
| 4,069,009 | 1/1978 | Yamawaki ............................ 432/122 |
| 4,098,923 | 7/1978 | Alberti et al. ........................ 427/93 |
| 4,108,106 | 8/1978 | Dozier .................................. 427/82 |
| 4,203,387 | 5/1980 | McMullen et al. |
| 4,220,116 | 9/1980 | Hochberg ............................. 118/728 |
| 4,256,053 | 3/1981 | Dozier . |
| 4,309,240 | 1/1982 | Zaferes . |

FOREIGN PATENT DOCUMENTS 2557367 6/1976 Fed. Rep. of Germany .

OTHER PUBLICATIONS

Patent Abstracts of Japan vol. 3, No. 78, Jul. 5, 1979, p. 55E121 & JP-A-56376.
Patent Abstracts of Japan vol. 1, No. 146, Nov. 26, 1977, p. 7457E77 & JP-A-52-85476.
Patent Abstracts of Japan vol. 2, No. 20, Feb. 9, 1978, p. 11325E77 & JP-A-52-139379.

Primary Examiner—John D. Smith
Attorney, Agent, or Firm—Sidney T. Jelly

[57] ABSTRACT

In the production of coatings on semiconductor wafers, fragile equipment is used and also difficulties in obtaining uniform coatings arise. The invention provides a form of boat for holding wafers and a manifold structure for feeding gases to the boats, and wafers which are less fragile cheaper and easier to manufacture and give more uniform coatings. The boats are relatively short, of semi-cylindrical form with slots through which gas can flow, and with rails for positioning and holding wafers at correct heights. The manifolds have apertures which are spaced at varying distances along the manifold as compared to the conventional longitudinal slot. The invention is particularly applicable to producing oxide coatings and polycrystalline silicon coatings on silicon wafers.

23 Claims, 8 Drawing Figures

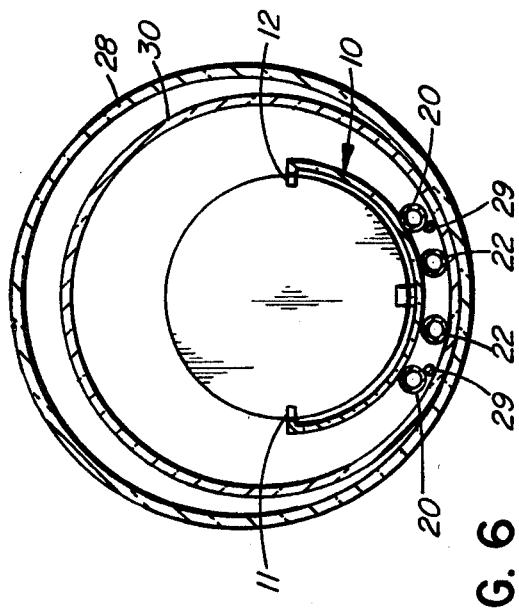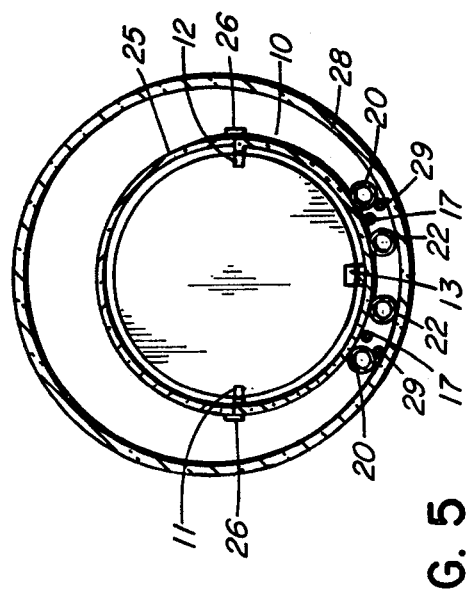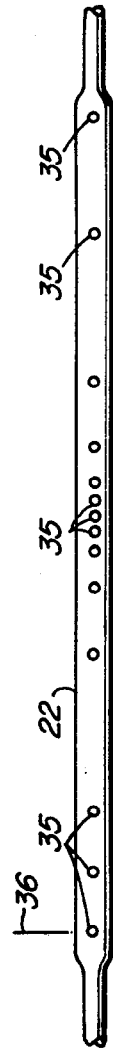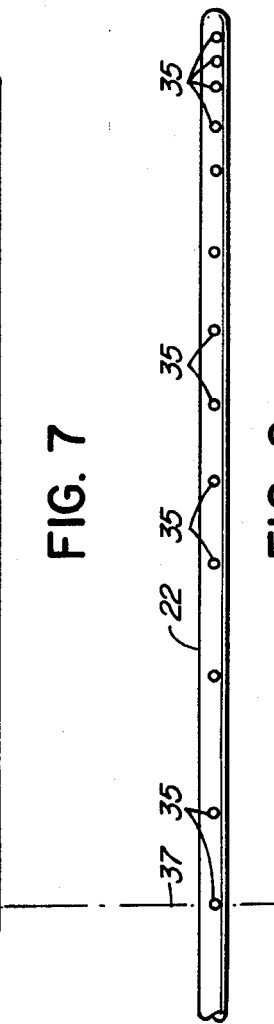

COATING OF SEMICONDUCTOR WAFERS AND APPARATUS THEREFOR

This application is a continuation of application Ser. No. 250,163, filed Apr. 2, 1981 now abandoned.

This invention relates to the coating of semiconductor wafers, in particular silicon wafers.

During manufacture of semiconductor devices, semiconductor wafers, particularly silicon wafers, are coated with an oxide layer, or other layer, such as doped or undoped polycrystalline silicon. Typically the oxide is silicon dioxide and may be doped, for example with phosphorus. The wafers are mounted in boats which are supported in furnaces and suitable gases fed to the boats, with the resulting formation or growing of the coatings. More than one layer or coating may be formed, for example a first layer of oxide and then a layer of polysilicon. Also an initial layer may have been produced by some other process.

One conventional form of boat comprises a plurality of glass (quartz) rods attached at each end to the peripheries of two semicircular end plates to form a "cage". A rail along each side at the top of the plates and a rail at the center bottom are slotted to provide spaced location for the wafers. A top or cover of glass (quartz) fits over the boat, the top being semi-cylindrical. A rectangular "box" made from quartz plates surrounds and supports the "cage" and is welded to it.

A conventional boat is, in one example, about 29½" length, one boat being positioned in a furnace at a time. The boat is supported by the two parallel plates which form the sides of the box and two glass tube manifolds pass along between the side plates, under the boat. A longitudinal slit extends in each manifold for a distance corresponding to the length of the boat.

A conventional boat is expensive and fragile. Stresses are created when the rods and rails are welded to the side and end plates and, even with very careful handling, breakages occur in wafer processing. The glass tube manifolds are also expensive, the longitudinal slit being particularly expensive to produce.

A further problem is that growth rate, and therefore the thickness of the coating, varies along the boat. In particular the growth rate is low at the center of the boat and increases towards each end, although there may be a fall off or reduction at the ends.

The present invention provides a boat which is less fragile, cheaper to manufacture and can be made in short lengths, several boats being used together. The manifolds, instead of a longitudinal slit, each have apertures, such as holes or transverse slits, the spacing being varied along the manifold. A more uniform, consistent, growth rate is obtained and an increase in growth rate can be achieved with a reduced variation in thickness.

A boat, in accordance with the invention, comprises a semi-cylindrical glass member having a slotted rail along each top edge and along the center on the inside at the bottom. Transverse slots are cut in the glass member. The manifolds comprise glass tubes with apertures spaced along the length positioned under the boat or boats. Gases are fed from one or both ends of the manifolds, the flow of gases being controlled.

Figure 1:
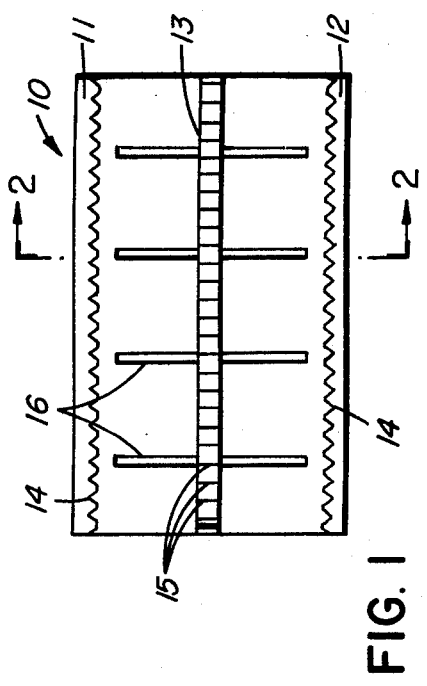
Figure 3:
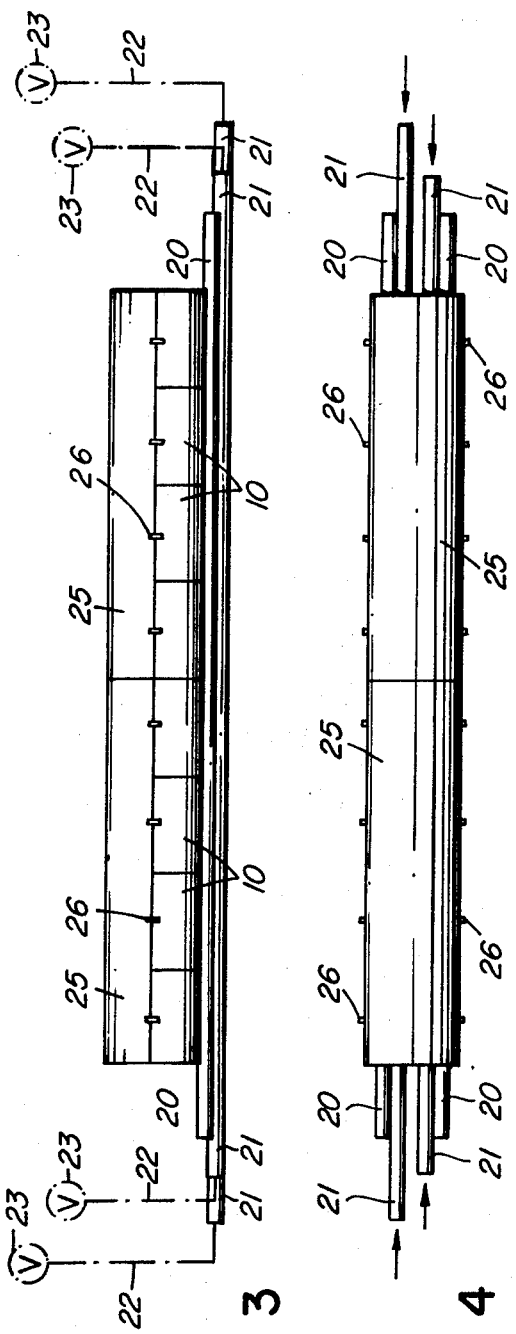
Figure 4:
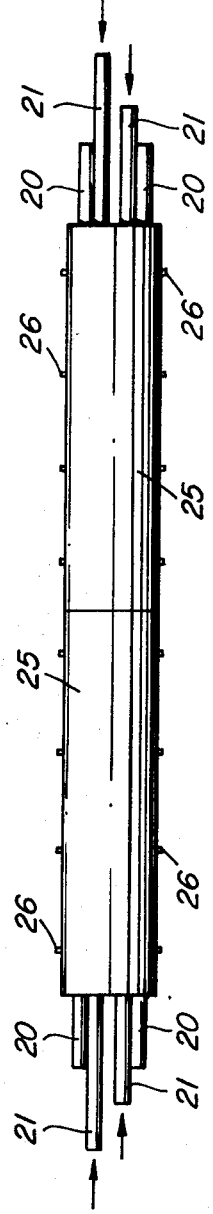

The invention will be readily understood by the following descriptions of certain embodiments, by way of example, particularly relating to forming oxide coatings on silicon wafers, in conjunction with the accompanying drawings, in which:

FIG. 1 is a top plan view of a boat;
FIG. 2 is a cross-section on the line 2—2 of FIG. 1;
FIGS. 3 and 4 are side and top plan views respectively of boats assembled to the support and manifold system in one configuration;
FIG. 5 is a cross-section, similar to that of FIG. 2, of a boat and cover on support tubes and with manifolds in a furnace;
FIG. 6 is a cross-section, similar to that of FIG. 5, of an alternative configuration, the boats not having covers;
FIG. 7 is a top plan view of a manifold with gas feeds at both ends.
FIG. 8 is a top plan view of a manifold with gas fed to one end only.

As seen in FIGS. 1 and 2, a boat 10 comprises a semi-cylindrical member of glass-quartz—with top rails 11 and 12 along the top edges and a bottom rail 13 on the center at the bottom. The top rails are slotted, at 14, and the bottom rail is similarly slotted, at 15. The slots 14 and 15 position and support wafers in the boat. Transverse slots 16 are made in the semi-cylindrical member. Attached to the exterior of the boat, near the bottom, spaced on either side of the longitudinal axis, are two small rods 17, the purpose of which will be explained later.

FIGS. 3 and 4 illustrate a typical arrangement using boats of the invention. The boats are supported on two tubes 20, and tubular manifolds 21 are positioned beneath the boats. Gases are fed to the manifolds at both ends indicated by the chain dotted lines 22, the flow rates controlled by valves 23. In the example the boats are of a length that eight boats are loaded, end-to-end. Covers 25 rest on top of the boats, the covers being semi-cylindrical members of glass-quartz. The covers are of a length to fit over four boats, but can be of different lengths, for example a cover for each boat. The covers are located by small tabs 26 attached to the bottom edges of the covers. The manifolds 21, and support tubes 20, are generally of glass, but can be of any other suitable material, e.g. stainless steel.

FIG. 5 illustrates, in cross-section, the arrangement of boats 10, covers 25, support tubes 20 and manifolds 21 in a furnace tube 28. The manifolds 21 are first slid in and connected to the gas supply lines. This positions the manifolds on the bottom of the furnace tube 28. The support tubes 20 are connected at each end by a transverse member and the boats are loaded on to the support tubes, the boats filled with wafers. The covers 25 are assembled to the boats and then the whole assembly of support tubes, boats and covers slid into the furnace tube. The transverse members connecting the support tubes are arched to clear the manifolds. The rods 17 are positioned inside the tubes 20, to avoid the possibility of rotation of the boats. However, the rods 17 are not essential and can be omitted.

To correctly position the boats, glass rods 29 can be attached to the support tubes 20, the rods resting on the base of the furnace tube 28.

In an alternative arrangement, illustrated in FIG. 6, the covers 25 are omitted and the boats, with support tubes and manifolds assembled within a quartz liner, which in turn is within the furnace tube. Thus, in FIG. 6, items common with FIG. 5 are given the same reference numbers. The liner is indicated at 30. The liner rests at the bottom on the bottom of the furnace tube and the support tubes 20 and manifolds 21 rest on the bottom of the liner. Rods 29 can be provided as previously.

The use of a liner, 30, as in FIG. 6, provides various advantages. The liner avoids the necessity of the occasional removal of the furnace tube for cleaning, thus avoiding breaking and remaking vacuum connections and consequential testing for leaks. The use of covers is avoided, thus reducing costs. While vertical positioning of the boats may be more critical without covers, this is readily obtained. Also, some slight non-uniformity of the coating at the peripheral edges of the wafers can often be accepted as usable devices are often not produced within about ¼" or so of the periphery. A typical size for the liner is 140 mm internal diameter and 146 mm external diameter.

FIG. 7 illustrates one form of manifold 21, in which gases are fed to both ends. Apertures 35 such as circular holes or transverse slots are cut in the top of the manifold and the spacing along the length which is below the boats, between lines 36, is varied along this length.

The dimensions and spacing of slots 14, 15 and 16 and the apertures 35, and other details, will depend upon various variables, including wafer diameter. As an example, the following relates the various parameters for 100 mm diameter wafers. The conventional system uses a holder which is 29" long, and this length is largely determined by the so-called "flat length" of the furnace, the length over which the temperature is constant and consistent.

In the example of FIGS. 1, 2 and 5, the internal diameter of the holder, base 10 and cover 25, is 105 mm, and the outside diameter 110 mm. The length of the base, or boat, 10 is about 5". The spacing of slots 14 and 15 is 3/16". Slots 16 are 2.5 mm wide and extend up to about 1" from the top edges of the rails 11 and 12. Four slots 16 are provided, evenly spaced from each other and the ends of the boat. The distance the bottom of the wafer is spaced from the bottom of the boat is important as this can affect the coating thickness at the edge of the wafer which is at the bottom. The rail 13 is made of such a height that the bottom surfaces of the slots 15 is approximately 5 mm above the surface of the boat.

The tubes 20 are 19 mm external diameter and 14 mm internal diameter. The manifolds 21 are 14 mm external diameter and 12 mm internal diameter in the apertured length and 12 mm O/D, 8 mm O/D at the ends. The manifolds are spaced about 1" apart symmetrically about the longitudinal axis, and the tubes 20 about 2" apart. The internal diameter of the furnace tube 28 is 150 mm. The spacing, or positioning of the apertures 35 in the manifold 21, is, for example, as follows, starting at line 36 at the left in FIG. 7, with the position at line 31 as zero: 0, 1½", 5½", 10", 13", 13½", 14", 14½", 15", 16", 17", 23", and 29", the 29" position being at the line 31 to the right in FIG. 7.

The manifolds 21, instead of being fed from both ends, as is conventional, can be fed from one end only. Such a manifold is illustrated in FIG. 8. This is particularly convenient in that the gas flow controls are considerably simpler. The spacing of the apertures 35 will be different and starting at a line 37, at the left in FIG. 8, corresponding to line 36 at the left in FIG. 7, a typical aperture spacing is as follows: 0", 4", 9", 13", 16", 19", 22", 25", 28", 30", 32", 33", 34".

Also, whether fed from one end only, or both ends, the manifolds can be the same diameter for the full length, for example 12 mm inside diameter and 14 mm external diameter, also illustrated in FIG. 8.

Circular holes for the apertures 35 are generally the most convenient to form and less affected by any variation in tube diameter and thickness. However the apertures can be of other forms, for example transverse slots, as formed by cutting with a saw. A typical slot size is 6.5 mm by 2.5 mm in plan view.

In the conventional system, as stated previously, there is a variation in the growth rate and thickness of coating, along the length of the holder. This can be as much as ±10% from the specification. By varying the spacing of the apertures 35, the flow of gases into the boats can be controlled and the variations reduced to ±3%. A very large advantage obtained from this ability to controlling the gas flow is that the flow rates can be increased considerably, with associated increase in growth rate, without any unacceptable increase in growth non-uniformity across a wafer. Thus, as an example, in the conventional system, with a growth rate of about 200 Angstroms/min, the variation is the above mentioned ±10% while with the present invention the variation is about ±3%. At higher flow rates and higher growth rates, the variation in the conventional system rises rapidly, up to ±30% or more. With the present invention with a growth rate of about 420 Angstroms per minute, variations of about ±4% are obtained.

A typical process is as follows. Eight boats or bases are loaded with wafers. Generally two wafers are loaded into the boats in pairs, back-to-back, in alternate slots 14 and 15. This will produce a layer or coat on one side of each wafer. Alternately if single wafers are loaded then they will have layers or coatings grown on both sides. After loading the boats they are positioned on the tubes 20. In one configuration, the covers 25 are positioned on the boats and the assembly pushed into the furnace tube. This positioning in the furnace tube is conventional. The manifolds 21 normally remain positioned in the furnace tube, connected to gas supplies. In the alternative configuration, the liner is positioned in the furnace tube and the manifolds inserted and then liner and manifolds normally remain in the furnace, removed only for cleaning. After loading of the boats they are positioned on the tubes 20 and the assembly then pushed into the liner.

A mixture of silane and phosphine, SiH$_4$+PH$_3$, is fed to one or both ends of one manifold and oxygen is fed to one or both ends of the other tube. The silane is pure, and the phosphine, in a typical example, is 22½% of the gas, the remainder (77½%) being nitrogen, that is the phosphine supply is a mixture of phosphine and nitrogen. The ratio of silane and phosphine determines the amount of phosphorous in the oxide layer and the ratio is not critical to the invention. The layer may have from 0 to 10% phosphorus, depending upon requirements.

In the production of the oxide layer, the wafers are cleaned prior to loading, and then after insertion in the furnace, the furnace is purge evacuated, the evacuation kept up for a short time. Then oxygen is admitted, for about 25 minutes, then the silane/phosphine gases are admitted, for about 35 minutes. Then there is purging and then removal. The temperature of the furnace is about 410° C. Typical flow rates are, oxygen 117 cc/minute at 40 psi, SiH$_4$ 90 cc/minute at 15 psi, PH$_3$ (22½%) 40 cc/minute at 15 psi.

The invention enables wafers having a high level of consistency to be produced. By using eight boats, for example, which gives an overall length in excess of the conventional 29", more useful wafers are produced.

The end wafers are not usually acceptable and the excess length of the boats provides spare wafers which assist in producing consistent results for the full "flat length" of the furnace. While the covers 25 are shown as solid, slots may be cut in the covers, similar to slots 16 in the boats. The boats are sturdy, cheaper to make and less liable to breakage. The manifolds are cheaper to make and also less fragile. The arrangement of apertures 35 provides even flow of gases. The actual spacing and relative positioning can be varied to provide consistent conditions. While the dimensions given above have produced good results in the exemplified process, the spacing can be varied and desirable spacing can readily be determined by plotting the oxide layer thickness along the line of boats. The spacing of the slots 14 and 15 can also be varied. The spacing of the slots 14 and 15 affects the thickness, that is the growth rate, and also the uniformity. Too close a spacing will cause lack of uniformity across a wafer.

Additional boats can be used, with wafers therein, to create a baffle effect. The excess gases flow out of the ends of the end boats and the extra wafers also help to reduce coating on the apparatus, and reduces the amount of cleaning of the furnace tube necessary.

While, as explained, the invention has been described in relation to the treatment of wafers of 100 mm diameter, the invention is equally applicable to wafers of other sizes. For wafers of other sizes, the dimensions of the boats, manifolds and other structures may vary and also the gas flows will vary. The drawings are illustrative only and are not to scale.

The invention can also be used to form other coatings on wafers, for example polycrystalline silicon. A sequence of coatings, or layers, can be produced. The invention is applicable to any process in which wafers are mounted in boats and exposed to gas flows in a furnace, in the conventional manner originally described. In its broadest aspect, the invention has two features, the provision of a cheaper more effective boat for holding wafers, and the provision of a novel manifold which gives an improved process, with improved results. In some forms of apparatus, and processes, it can be that a gas, or mixture of gases, is supplied by one manifold only, the manifold being in accordance with the manifold of the present invention.

What is claimed is:

1. Apparatus for producing coatings on semiconductor wafers with reduced fringing, including a boat for carrying said wafers, said boat comprising:
   an elongate semi-cylindrical quartz member having top edges and open ends;
   a top rail extending along each top edge of the quartz member, the rails extending inward;
   a central rail extending along the inside of the quartz member at the bottom, the rail extending upwards;
   slots in said top rails and said central rail to hold said wafers at desired spacings, said slots at predetermined intervals;
   said slots in said central rail having bottom surfaces at a height to hold said wafers at a predetermined height above the bottom of the boat;
   transverse slots in said quartz member for enabling the flow of gases substantially radially up into said boat;
   an imperforate cover member positioned over said boat such that excess gases flow out of said open ends of said boat.

2. Apparatus as claimed in claim 1, said cover member comprising a semi-cylindricl quartz member resting on said boat.

3. Apparatus as claimed in claim 2, including locating tabs on said cover to locate and retain said cover on said boat.

4. Apparatus as claimed in claim 3, said cover extending over a plurality of boats.

5. Apparatus as claimed in claim 2, said bottom surfaces of said slots in said central member at a height to hold the wafers substantially central in said boat.

6. Apparatus as claimed in claim 1, including a pair of support members spaced apart in parallel relationship, the boat resting on said support members.

7. Apparatus as claimed in claim 6, said support members being glass tubes.

8. Apparatus as claimed in claim 7, including glass rods extending along under said glass tubes and attached thereto, to support said boats at a predetermined height in a furnace tube, said rods resting on the bottom of the furnace tube.

9. Apparatus as claimed in claim 6, including two manifolds in parallel spaced apart, relationship.

10. Apparatus as claimed in claim 9, said manifolds extending between said support members.

11. Apparatus as claimed in claim 6, said support members adapted to position said boats at a predetermined height in a furnace tube, said support members resting on the bottom of the furnace tube.

12. Apparatus as claimed in claim 6, including a furnace having a furnace tube, said support members, boats and manifolds positioned in said furnace tube, the support members and said manifolds resting on the bottom of the furnace tube, and gas supply means for supplying gases to said manifolds.

13. Apparatus as claimed in claim 12, for producing silicon oxide coatings on silicon wafers, said means for supplying gases supplying oxygen to one manifold and a gas containing silane to the other manifold.

14. Apparatus as claimed in claim 13, said means for supplying gases including means for supplying a gas containing silane and phosphine.

15. Apparatus as claimed in claim 6, including a furnace having a furance tube, a liner tube within said furnace tube, said support members, boats and manifolds positioned in said liner tube, said support members and said manifolds resting on the bottom of said liner tube, and gas supply means for supplying gases to said manifolds.

16. Apparatus as claimed in claim 15, for producing silicon oxide coating on silicon wafers, said means for supplying gases supplying oxygen to one manifold and a gas containing silane to the other manifold.

17. Apparatus as claimed in claim 16, said means for supplying gases including means for supplying a gas containing silane and phosphine.

18. Apparatus as claimed in claim 1, including at least one manifold for delivery of gases, said manifold positioned beneath the boat and being a glass tube with apertures spaced along the tube in a top surface thereof, the spacing of said apertures being varied in a predetermined manner.

19. Apparatus as claimed in claim 18, said tube open at both ends, and adapted to be fed with gases at each end.

20. Apparatus as claimed in claim 18, said tube open at one end and closed at the other, and adapted to be fed with gases at said open end.

21. Apparatus as claimed in claim 18, said apertures being round holes.

22. Apparatus as claimed in claim 18, said apertures being transverse slots.

23. Apparatus as claimed in claim 1, including a pair of spaced parallel rods extending along the outer surface of the member on either side of the longitudinal axis of the member.

* * * * *